(12) United States Patent
Kim et al.

(10) Patent No.: US 6,750,729 B2
(45) Date of Patent: Jun. 15, 2004

(54) TEMPERATURE COMPENSATED CRYSTAL OSCILLATOR AND METHOD OF MANUFACTURING THE SAME

(75) Inventors: Jong Tae Kim, Kyungki-do (KR); Hyung Kon Kim, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 7 days.

(21) Appl. No.: 10/137,287

(22) Filed: May 3, 2002

(65) Prior Publication Data

US 2003/0122631 A1 Jul. 3, 2003

(30) Foreign Application Priority Data

Dec. 27, 2001 (KR) ........................... 2001-85734

(51) Int. Cl.[7] ................................. H03L 1/00
(52) U.S. Cl. ......................... 331/176; 331/66
(58) Field of Search ................. 331/66, 68, 108 D, 331/158, 175, 176

(56) References Cited

U.S. PATENT DOCUMENTS 6,229,404 B1    5/2001  Hatanaka ................. 331/68

FOREIGN PATENT DOCUMENTS

JP    08172315 A  *  7/1996  ........... H03B/5/32

* cited by examiner

*Primary Examiner*—Timothy P. Callahan
*Assistant Examiner*—Cassandra Cox
(74) *Attorney, Agent, or Firm*—Lowe Hauptman Gilman & Berner LLP

(57) ABSTRACT

A temperature compensated crystal includes a crystal package including a package board and a crystal oscillating piece, conductive patterns for constituting a temperature compensating circuit formed on a surface of the package board, exterior terminals formed at corners of the board, temperature compensating components formed on the surface of the board, and resin molded part enveloping the surface of the board. With a lower surface of a crystal package serving as a component mounting area, it is not necessary to provide an additional printed circuit board required for mounting of temperature compensating components, and it is possible to provide a compact TCXO having a surface area corresponding to that of a crystal package.

13 Claims, 7 Drawing Sheets

TEMPERATURE COMPENSATED CRYSTAL OSCILLATOR AND METHOD OF MANUFACTURING THE SAME

BACKGROUND OF THE INVENTION

1. Field of the Invention

The present invention relates to a temperature compensated crystal oscillator and a method of manufacturing the oscillator, and more particularly to a temperature compensated crystal oscillator and a method of manufacturing the oscillator which is intended to achieve compactness of a product by making use of a bottom surface as an area for accommodating components.

2. Description of the Prior Art

A crystal oscillator employing a quartz oscillator is an essential component used to generate an oscillation frequency for controlling transmission and reception of signals between mobile communication terminals, and is superior to other oscillators in terms of frequency stability. However, the quartz oscillator has a drawback in that its oscillation frequency varies depending on ambient temperature. To overcome this drawback, the crystal oscillator must be additionally provided with certain components for compensating frequency variation owing to temperature characteristics of the quartz oscillator. Such a crystal oscillator is referred to as a temperature compensated crystal oscillator (TCXO).

In general, a temperature compensating circuit of the TCXO comprises a temperature detection circuit employing resistance variation of a thermistor, a controlled voltage generating circuit for controlling a voltage according to the resistance variation, and a frequency adjusting circuit for adjusting frequency by capacitance regulation according to the controlled voltage. According to presence of the temperature compensating circuit, the TCXO is classified into a one-chip type TCXO using an integrated circuit (IC) chip, and a discrete type TCXO having components such as piezoelectric elements, integrated circuits, capacitors, inductors and resistive elements mounted thereon.

In general, although the discrete type TCXO is superior to the one-chip type TCXO in terms of phase noise characteristic, the discrete type TCXO is difficult to be made compact because it must contain various components. Accordingly, the discrete type TCXO is severely restricted in its adoption into a mobile communication terminal due to its large size, despite its excellent characteristics.

FIGS. 1a and 1b are a plan view and a side view showing a conventional discrete type TCXO 100. As shown in FIG. 1a, the discrete type TCXO 100 is configured to have a printed circuit board 101, a crystal package 103 mounted on the printed circuit board 101, and components 105 of a temperature compensating circuit arranged at both sides of the crystal package 103. As appreciated from FIG. 1b, the components 105 are positioned at a level lower than that of the crystal package 103.

The temperature compensating components 105 usually occupy an area 2 to 3 times as large as an area of the TCXO 100 (5.0×3.2 $mm^2$ or 4.7×2.9 $mm^2$). Consequently, the printed circuit board 101 incorporated in the TCXO requires an area far larger than that of the TCXO. Hence, an area of a finished product will also become large (for example, 7.0×5.2 $mm^2$).

As such, there is a considerable limitation to compactness of a conventional temperature compensated crystal oscillator because of a space required to accommodate the temperature compensating components. On this account, such a discrete type TCXO cannot be successfully adopted into mobile communication terminals.

Therefore, there has been strongly required a temperature compensated crystal oscillator and a method of manufacturing the same in the art, in which a space for accommodating temperature compensating components is minimized.

SUMMARY OF THE INVENTION

Accordingly, the present invention has been made keeping in mind the above problems occurring in the prior art, and an object of the present invention is to provide a temperature compensated crystal oscillator which is intended to achieve compactness of a product by making use of a bottom surface as an area for accommodating components.

Another object of the present invention is to provide a method of manufacturing the temperature compensated crystal oscillator.

In order to accomplish the above object, the present invention provides a temperature compensated crystal oscillator comprising: a crystal package including a package board and a crystal oscillating piece disposed on the package board; first and second conductive patterns formed on a surface of the package board; components for constituting a temperature compensating circuit, which are disposed at the first conductive patterns within a component mounting area defined by the first conductive patterns; exterior terminals disposed at the second conductive patterns within terminal forming areas defined by the second conductive patterns; and a resin molded part formed on the surface of the package board for protecting the temperature compensating components.

In an embodiment of the present invention, each of the exterior terminals may be formed to have a rectangular shape in transverse section, so that the surface of the package board except for the exterior terminals assumes a cruciform shape in plan.

In another embodiment of the present invention, each of the exterior terminals may be formed to have a triangular shape in transverse section, so that the surface of the package board except for the exterior terminals assumes an octagonal shape in plan. According to this embodiment, it is possible to provide a surface of a package board with a relatively large area required for mounting of components.

Furthermore, to more efficiently use the surface of the package board, at least one of the temperature compensating components is preferably disposed between two exterior terminals formed at either one of the four sides of the package board.

In a further preferable embodiment, the exterior terminals may be shaped such that a height thereof is equal to or larger than a height of the highest component, and the resin molded part may be molded such that the exterior terminals are exposed at ends thereof and the components are completely enveloped by the resin molded part.

In addition, the present invention provides a method of manufacturing a temperature compensated crystal oscillator comprising the steps of: preparing a crystal package including a package board and a crystal oscillating piece disposed on the package board; forming first and second conductive patterns on a surface of the package board; placing components for constituting a temperature compensating circuit at the first conductive patterns within a component mounting area defined by the first conductive patterns; forming exterior terminals at the second conductive patterns within terminal forming areas defined by the second conductive patterns; and molding the surface of the package board with resin material for protecting the temperature compensating components.

BRIEF DESCRIPTION OF THE DRAWINGS

The above and other objects, features and other advantages of the present invention will be more clearly understood from the following detailed description taken in conjunction with the accompanying drawings, in which:

FIG. 1b is a side view of FIG. 1a;

FIG. 4b is a perspective view of a finished TCXO of FIG. 4a;

DETAILED DESCRIPTION OF THE INVENTION

This invention will be described in further detail by way of example with reference to the accompanying drawings.

Figure 2:
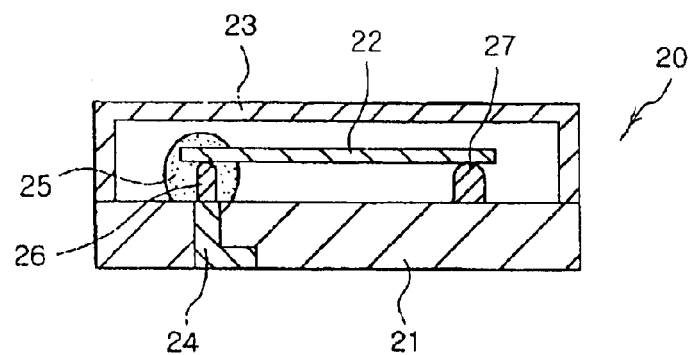
FIG. 2 is a side cross-sectional view of a commonly used crystal package including a crystal oscillating piece therein.

FIG. 2 is a side cross-sectional view of a crystal package according to an embodiment of the present invention. As shown in the drawing, the crystal package 20 constituting a crystal oscillator comprises a ceramic board 21 with a crystal oscillating piece 22 placed thereon. The ceramic board 21 is covered with a metal cover 23. The metal cover 23 serves to protect the crystal oscillating piece 22 from external electrical and mechanical influences.

The crystal oscillating piece 22 is fixed at its one end to a first bump 26 by conductive adhesive 25. In addition, the crystal oscillating piece 22 rests at the other end on a second bump 27 to be freely oscillated. The first bump 26 is connected at its lower end to a conductive via hole 24 for allowing the first bump 26 to be connected to external devices.

The crystal package 20 is commonly used in the art, and is disclosed as only an example of the present invention, but the crystal package is not intended to limit the scope of the present invention. That is, the crystal package 20 can be configured into any structure as long as the crystal oscillating piece is placed on the ceramic board 21.

Figure 3A:
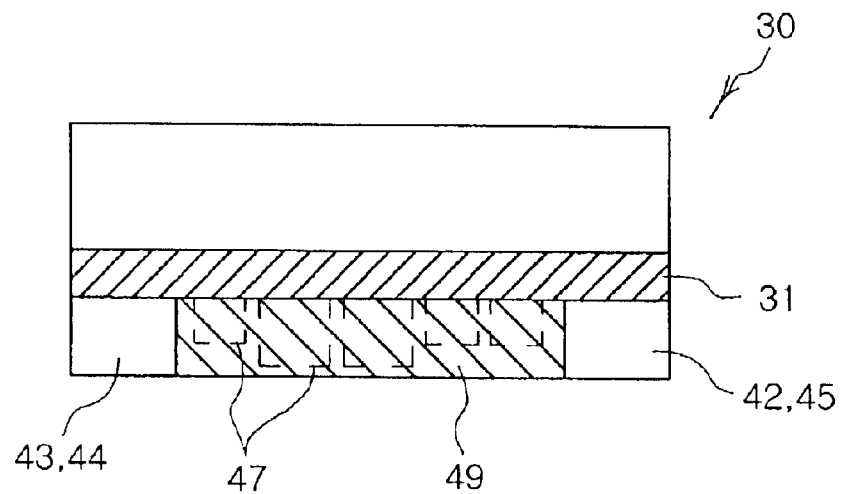
FIGS. 3a and 3b are a side cross-sectional view and a bottom view of a TCXO according to an embodiment of the present invention.
Figure 3B:
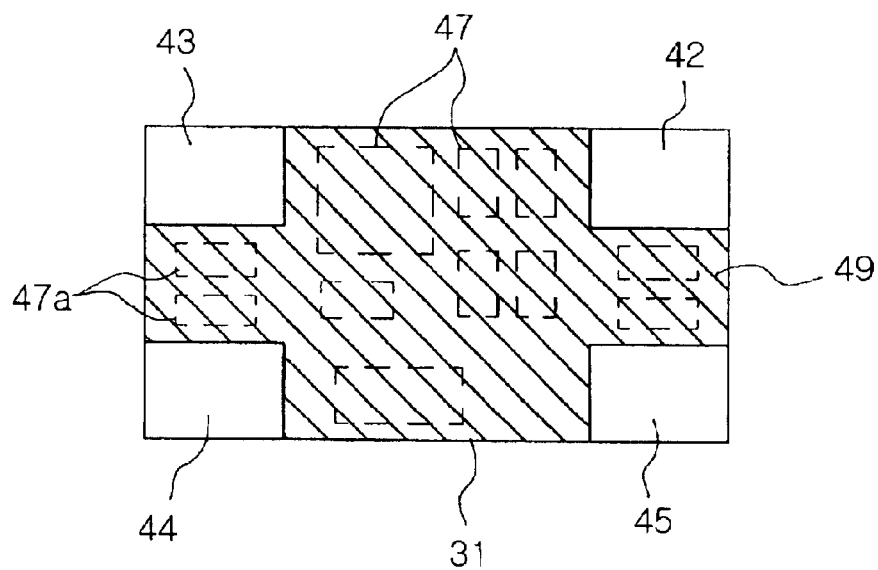

FIGS. 3a and 3b are a side cross-sectional view and a bottom view of an embodiment of the present invention. As shown in FIG. 3a, a temperature compensated crystal oscillator according to the present invention includes an upper crystal package 30 and a package board disposed under the crystal package 30. The package board 31 is printed at its lower surface with a conductive pattern (not shown) to form a predetermined circuit for allowing connection to a temperature compensating circuit and external devices.

The lower surface of the package board 31 is provided at its four corners with exterior terminals 42 to 45. Each of the exterior terminals 42 to 45 consists of an upright structure having a certain height. The lower surface of the package board 31 is mounted with temperature compensating components 47 at an area except for the areas occupied by the exterior terminals 42 to 45.

The area on which the temperature compensating components 47 are mounted is also provided with usual resin such as thermosetting resin, thermoplastic resin or epoxy resin to form a resin molded part 49 packaging the mounted components 47. The exterior terminals 42 to 45 are preferably shaped to be higher than heights of the components to be mounted. The resin molded part 49 is preferably shaped such that its lower surface flashes with a plane defined by the lower end surface of the four exterior terminals.

FIG. 3b is a bottom view showing the temperature compensated crystal oscillator of FIG. 3a. From the drawing, it will be fully appreciated how the lower surface of the package board 31 is configured.

As described with reference to FIG. 3a, the lower surface of the package board 31 is provided at its four corners with exterior terminals 42 to 45, respectively. Each of the exterior terminals 42 to 45 adopted in the embodiment has a rectangular section, and is positioned at each of four corners of the package board 31 such that the remaining lower surface of the package board 31 except for areas occupied by the exterior terminals assumes a cruciform shape. The cruciform configuration is intended to assure the largest possible area necessary to mount components. The cruciform area of the package board is mounted with temperature compensating components 47. As such, since the package board has a cruciform mounting area defined by the exterior terminals disposed at its corners, it is possible to mount components 47a even at a region between the two exterior terminals belonging to each side of the package board.

Although the temperature compensating component can be comprised of a single integrated circuit chip, it may be comprised of a plurality of components such as piezoelectric elements, capacitors, inductors and resistive elements in the case of discrete type TCXO.

The area on which the components are mounted is provided with resin material to form the resin molded part 49. The resin molded part 49 can be more reliably supported by the four exterior terminals 42 to 45 positioned at corners of the package board, and serves to protect the mounted components 47 from external shocks.

As such, although a conventional temperature compensated crystal oscillator is configured such that its crystal package has a lower surface, which is no more than a contact surface to be bonded to another board, the temperature compensated crystal oscillator according to the present invention makes use of the lower surface as a component mounting area in such a way that the package board 31 is printed at its lower surface with a conductive pattern to form a certain circuit, and is attached at its four corners with the exterior terminals 42 to 45.

Figure 1A:
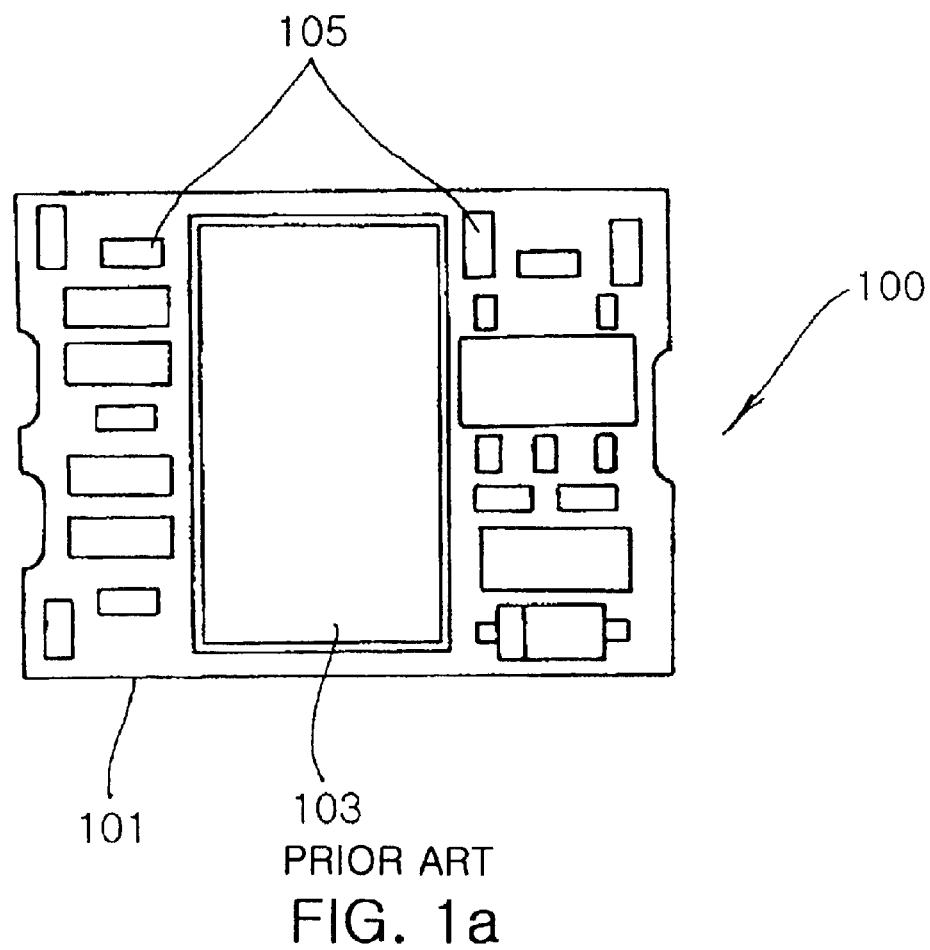
FIG. 1a is a plan view showing a conventional discrete type TCXO.
Figure 1B:
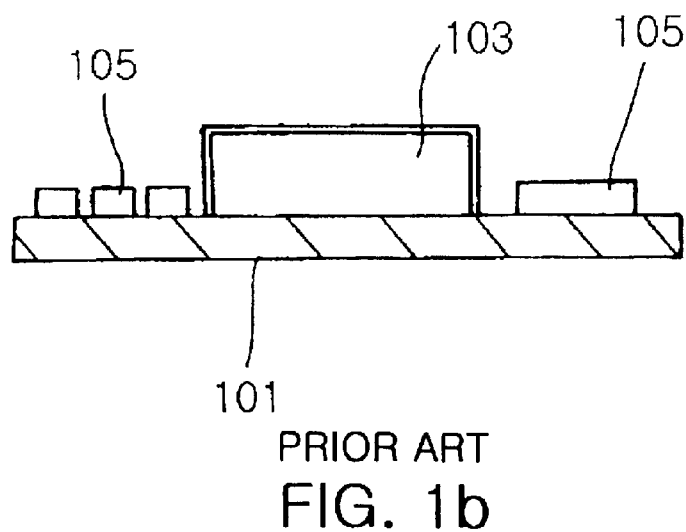

In other words, since a conventional temperature compensated crystal oscillator is configured such that temperature compensating components are horizontally arrayed on a relatively large board together with a crystal package, as illustrated in FIG. 1a, a finished TCXO must have a surface area three times or more as large as that of the crystal package. On the contrary, since the temperature compensated crystal oscillator according to present invention makes use of the lower surface of the crystal package as a component mounting area, it is not necessary to provide an additional printed circuit board for mounting components, thereby achieving reduction of cost and compactness of products.

Figure 4A:
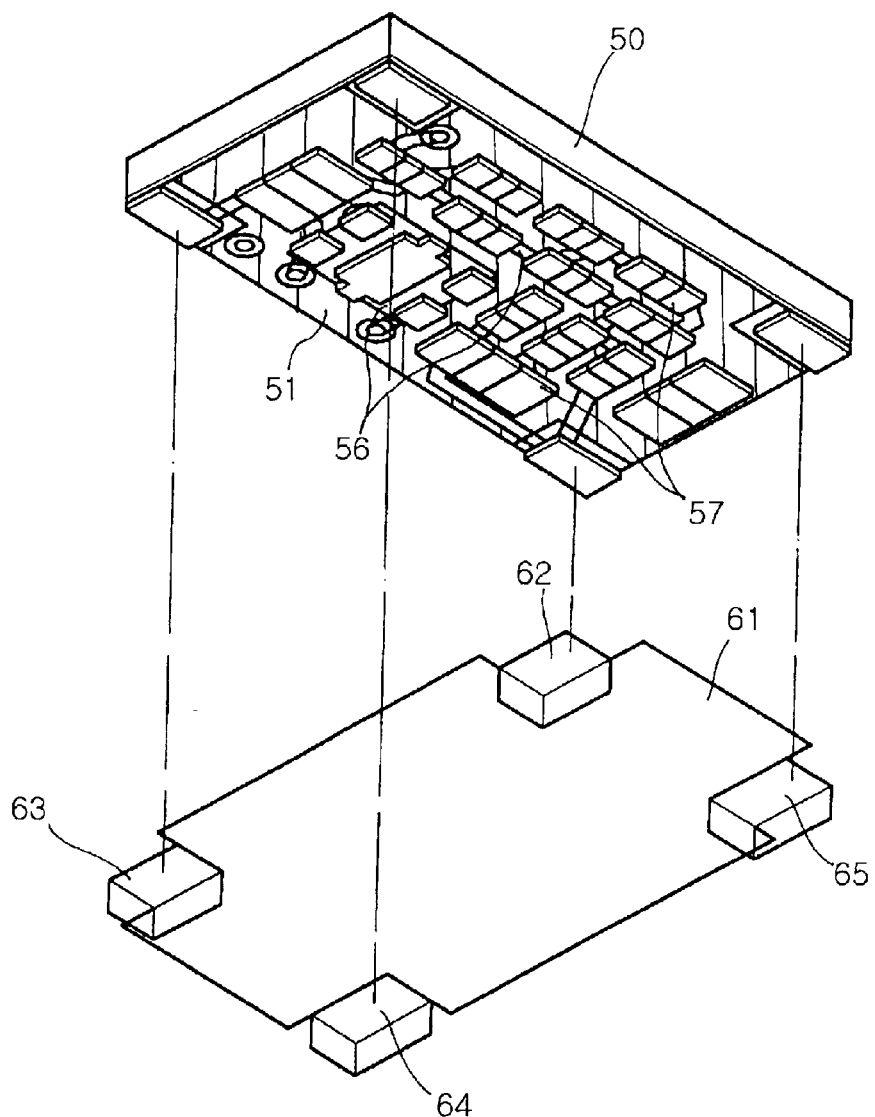
FIG. 4a is an exploded perspective view of a TCXO according to another embodiment of the present invention.

FIG. 4a is an exploded perspective view of a TCXO according to an embodiment of the present invention. As shown in the drawing, a board 51 of a crystal package 50 is provided at its lower surface with a conductive pattern 56 printed thereon and components 57 mounted on the crystal package 50 along the conductive pattern 56. In this embodiment, an additional printed circuit board 61 is used to form exterior terminals 62, 63, 64 and 65. That is, the printed circuit board 61, which has a surface area approximately equal to that of the crystal package 50, is formed at its corners with the exterior terminals 62, 63, 64 and 65, and is located at a proper position, and the printed circuit board 61 is removed from the exterior terminals 62, 63, 64 and 65. By such procedures, the package board 51 is formed at its corners with the exterior-terminals 62, 63, 64 and 65.

Figure 4B:
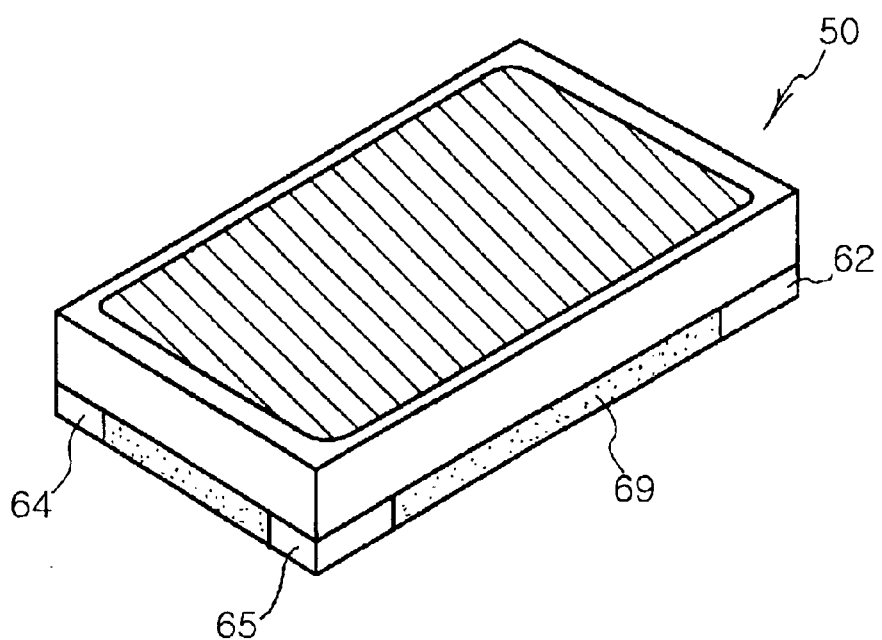

FIG. 4b shows a temperature compensated crystal oscillator produced by such processes. That is, FIG. 4b shows a TCXO produced by providing a resin molded part 69 to a lower surface of the crystal package prepared in FIG. 4a.

When the package board is intended to accommodate many components, it is essential to assure a sufficiently large area. To this end, shapes of the exterior terminals may be changed.

Figure 5:
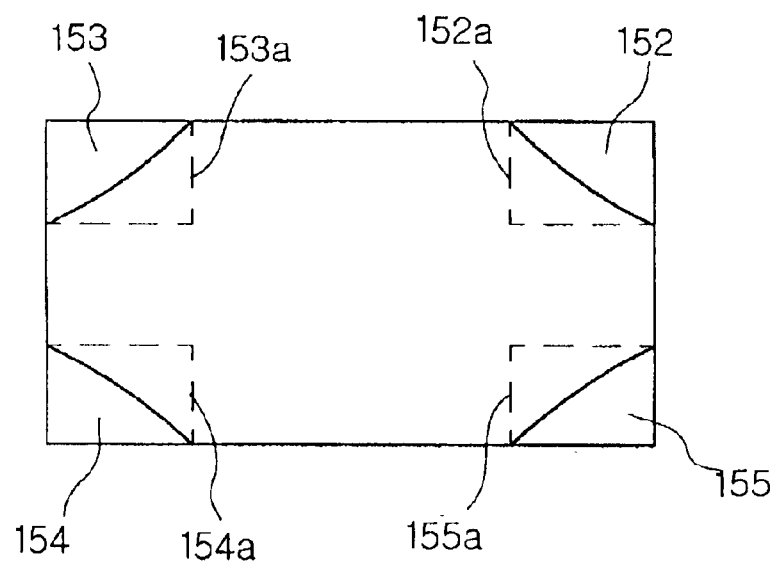
FIG. 5 is a bottom view of a TCXO according to a further embodiment of the present invention.

FIG. 5 is a bottom view showing a temperature compensated crystal oscillator according to another embodiment of the present invention. The temperature compensated crystal oscillator affords a larger component mounting area in such a way that the exterior terminals 152 to 155 are modified to have a triangular shape in section so that the component mounting area becomes octagonal. According to this embodiment, since the exterior terminals are reduced by half in section, the component mounting area of the package board can be further increased in area corresponding to removed areas 152a to 155a of the exterior terminals. In a further embodiment, positions of the exterior terminals may also be changed.

FIGS. 6a to 6e show a series of processing steps of a method of manufacturing a TCXO according to the present invention.

Figure 6A:
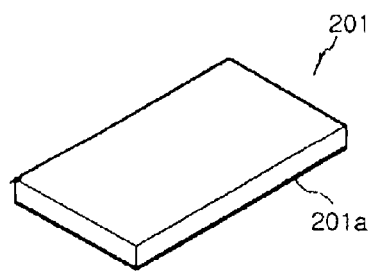
FIGS. 6a to 6e show a series of processing steps of a method of manufacturing a TCXO according to the present invention.

First, a crystal package 201 including a package board 201 and a crystal oscillating piece placed on the package board 101a is prepared, as shown in FIG. 6a.

Figure 6B:
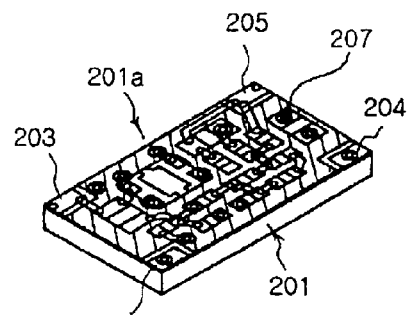

Subsequently, the crystal package 201 is turned over, and the package board 201a is formed with conductive patterns 202, 203, 204, 205 and 207, on which exterior terminals and components are formed and mounted, as shown in FIG. 6b. Areas for forming exterior terminals and areas for mounting components are determined by positions of the conductive patterns. Preferably, the patterns 202, 203, 204 and 205 for exterior terminals are formed on four corners of the package board, and the patterns 207 for components are formed on the package board such that they are positioned between the patterns for exterior terminals or at the center of the package board. Positions of the patterns are limited to this embodiment shown in the drawing, and can be variously changed.

Figure 6C:
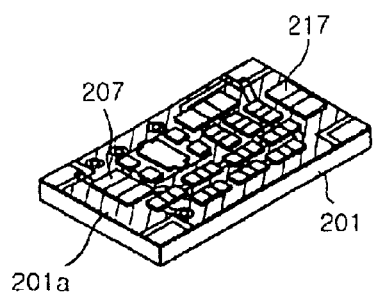

Then, components 217 for constituting a temperature compensating circuit are disposed along the conductive patterns 207, as shown in FIG. 6c.

Figure 6D:
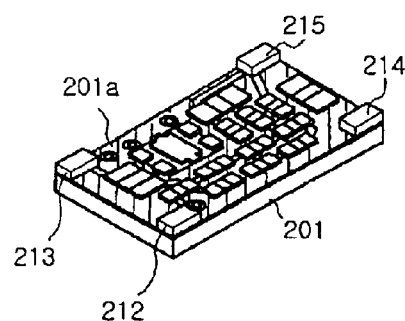

Exterior terminals 212, 213, 214 and 215 having a certain height are formed at the conductive patterns 202, 203, 204 and 205, as shown in FIG. 6d. If the order of mounting the components and forming the terminals is inverted, i.e., when the exterior terminals are formed prior to mounting of the components, an operation of mounting components may be hindered by the previously formed exterior terminals. Hence, it is preferable to carry out an operation of mounting components prior to an forming exterior terminals. Accordingly, an operation of mounting components can be easily carried out without difficulties occurring in mounting components in cavities formed at a conventional package board.

Figure 6E:
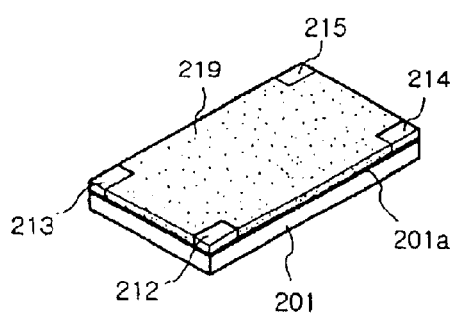

Finally, the package board is formed at its lower surface with a resin molded part 219, as shown in FIG. 6e, for protecting the temperature compensating components 217 (invisible in FIG. 6e). In this case, since the exterior terminals serve as columns for supporting the resin molded part, the resin molded part of the temperature compensated crystal oscillator can have a more reliable structural stability. In particular, where the temperature compensated crystal oscillator is equipped with four exterior terminals at its corners, the resin molded part can be more stable.

As described above, according to a temperature compensated crystal oscillator of the present invention, since a lower surface of a crystal package serves as a component mounting area, it is not necessary to provide an additional printed circuit board required for mounting of temperature compensating components, and it is possible to provide a compact TCXO having a surface area corresponding to that of a crystal package. Furthermore, as opposed to a process of mounting components in cavities formed in a crystal package, since an operation of mounting components can be carried out prior to forming of exterior terminals, it is easy to mount components on a crystal package.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A temperature compensated crystal oscillator, comprising:
   a crystal package including a package board and a crystal oscillating piece disposed on the package board;
   first and second conductive patterns formed on a surface of the package board;
   components constituting a temperature compensating circuit, said components being disposed at the first conductive patterns within a component mounting area defined by the first conductive patterns;
   exterior terminals disposed at the second conductive patterns within terminal forming areas defined by the second conductive patterns, wherein the exterior terminals are shaped such that a height thereof is equal to or greater than a height of the highest one among said components; and
   a resin molded part formed on the surface of the package board for protecting the temperature compensating circuit.

2. The temperature compensated crystal oscillator as set forth in claim 1, in which the second conductive patterns are formed at corners of the surface of the package board.

3. The temperature compensated crystal oscillator as set forth in claim 1, in which the resin molded part is molded such that the exterior terminals are exposed at ends thereof and the components are completely enveloped by the resin molded part.

4. The temperature compensated crystal oscillator as set forth in claim 1, in which each of the exterior terminals is formed to have a rectangular shape in transverse section, so that the surface of the package board except for the exterior terminals assumes a cruciform shape in plan.

5. The temperature compensated crystal oscillator as set forth in claim 1, in which each of the exterior terminals is formed to have a triangular shape in transverse section, so that the surface of the package board except for the exterior terminals assumes an octagonal shape in plan.

6. The temperature compensated crystal oscillator as set forth in claim 1, in which at least one of the components is disposed between two exterior terminals formed at either one of the four sides of the package board.

7. A method of manufacturing a temperature compensated crystal oscillator, said method comprising the steps of:

preparing a crystal package including a package board and a crystal oscillating piece disposed on the package board;

forming first and second conductive patterns on a surface of the package board;

placing components that constitute a temperature compensating circuit at the first conductive patterns within a component mounting area defined by the first conductive patterns;

forming exterior terminals at the second conductive patterns within terminal forming areas defined by the second conductive patterns, wherein the exterior terminals are shaped such that a height thereof is equal to or greater than a height of the highest one among said components; and forming a resin molded part on the surface of the package board for protecting the temperature compensating circuit.

8. The method as set forth in claim 7, in which in the step of forming conductive patterns, the second conductive patterns are formed at corners of the surface of the package board.

9. The method as set forth in claim 7, in which the resin molded part is molded such that the exterior terminals are exposed at ends thereof and the components are completely enveloped by the resin molded part.

10. The method as set forth in claim 7, in which each of the exterior terminals is formed to have a rectangular shape in transverse section, and is formed at one of corners of the surface of the package board.

11. The method as set forth in claim 7, in which each of the exterior terminals is formed to have a triangular shape in transverse section, and is formed at one of corners of the surface of the package board.

12. The method as set forth in claim 7, in which at least one of the components is disposed between two exterior terminals formed at either one of the four sides of the package board.

13. A temperature compensated crystal oscillator, comprising:

a crystal package including a package board and a crystal oscillating piece disposed on the package board;

first and second conductive patterns formed on a surface of the package board;

components constituting a temperature compensating circuit, said components being disposed at the first conductive patterns within a component mounting area defined by the first conductive patterns;

exterior terminals disposed at the second conductive patterns within terminal forming areas defined by the second conductive patterns; and a resin molded part formed on the surface of the package board for protecting the temperature compensating circuit;

wherein each of the exterior terminals is formed to have a triangular shape in transverse section, so that the surface of the package board except for the exterior terminals assumes an octagonal shape in plan.

* * * * *